(12) United States Patent
Kise (10) Patent No.: US 8,148,812 B2
(45) Date of Patent: Apr. 3, 2012

(54) THERMAL RESISTOR, SEMICONDUCTOR DEVICE USING THE SAME, AND ELECTRIC DEVICE

(75) Inventor: Koji Kise, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 322 days.

(21) Appl. No.: 12/303,879

(22) PCT Filed: May 10, 2007

(86) PCT No.: PCT/JP2007/059669
§ 371 (c)(1),
(2), (4) Date: Dec. 8, 2008

(87) PCT Pub. No.: WO2007/141987
PCT Pub. Date: Dec. 13, 2007

(65) Prior Publication Data
US 2010/0230804 A1    Sep. 16, 2010

(30) Foreign Application Priority Data
Jun. 7, 2006   (JP) .................................. 2006-158346

(51) Int. Cl.
*H01L 23/10*   (2006.01)
*H01L 23/043*  (2006.01)
(52) U.S. Cl. ........................................ 257/707; 257/706
(58) Field of Classification Search ................. 257/706, 257/707; 338/22 R; 323/294
See application file for complete search history.

(56) References Cited

U.S. PATENT DOCUMENTS

| 5,159,531 | A |   | 10/1992 | Horvath et al. |
| 5,567,986 | A | * | 10/1996 | Ishida ............................ 257/707 |
| 5,663,595 | A | * | 9/1997  | Shiomi et al. ................. 257/712 |
| 5,869,891 | A | * | 2/1999  | Rostoker et al. .............. 257/712 |

(Continued)

FOREIGN PATENT DOCUMENTS
JP        9 219970        8/1997
(Continued)

OTHER PUBLICATIONS

Office Action issued Aug. 5, 2010, in Germany Patent Application No. 11 2007 001 364.8-33 (with English-language Translation).

(Continued)

*Primary Examiner* — Sheila V. Clark
(74) *Attorney, Agent, or Firm* — Oblon, Spivak, McClelland, Maier & Neustadt, L.L.P.

(57) ABSTRACT

A thermal resistor is a metal body having a contact surface to be partially in contact to form a void and is electrically conductive as a whole. The thermal body may be a layered body having a plurality of metal bodies layered so as to be partially in contact with one another to form a void between them, or a metal body having a plurality of convex and concave portions on the surface, or a metal body formed by a plurality of metal plates each having a plurality of creases and layered so that the creases of the adjacent metal plates intersect, or a layered metal body formed by metal plates each having elasticity in the thickness direction and having elasticity in the layered direction as a whole, or metal body having a film formed by a different metal. Also disclosed in a semiconductor device having the thermal resistor inserted between a heating semiconductor element and a case cover and between a heat spreader and the case cover. Also disclosed is an electric device using the device.

25 Claims, 9 Drawing Sheets

U.S. PATENT DOCUMENTS

| | | | | |
|---|---|---|---|---|
| 5,896,269 | A * | 4/1999 | Autry | 361/704 |
| 6,208,517 | B1 * | 3/2001 | Prince et al. | 361/704 |
| 6,411,513 | B1 * | 6/2002 | Bedard | 361/704 |
| 6,448,575 | B1 * | 9/2002 | Slocum et al. | 257/48 |
| 6,538,878 | B1 | 3/2003 | Acker et al. | |
| 6,756,668 | B2 * | 6/2004 | Baek et al. | 257/704 |
| 2002/0005578 | A1 | 1/2002 | Kodama et al. | |
| 2002/0063327 | A1 * | 5/2002 | Chu et al. | 257/706 |
| 2004/0047125 | A1 | 3/2004 | Schmid et al. | |
| 2005/0265072 | A1 * | 12/2005 | Hart et al. | 365/163 |
| 2005/0274490 | A1 * | 12/2005 | Larson | 165/80.3 |
| 2006/0038281 | A1 * | 2/2006 | Colgan et al. | 257/706 |

FOREIGN PATENT DOCUMENTS

| | | |
|---|---|---|
| JP | 10 303340 | 11/1998 |
| JP | 11 274185 | 10/1999 |
| JP | 2001-274206 | 10/2001 |
| JP | 2004 251369 | 9/2004 |

OTHER PUBLICATIONS

Japanese Office Action dated Aug. 16, 2011, in Japanese Application No. 2008-520468 (with English Translation).

* cited by examiner

| Copper Plate Cooling | without (Natural Cooling) | | | with (Fan) | | |
|---|---|---|---|---|---|---|
| | Condition 1 | Condition 2 | Condition 3 | Condition 4 | Condition 5 | Condition 6 |
| Thermal Resistor | None | 1 sheet | 6 sheets | None | 1 sheet | 6 sheets |
| T3 | 200°C | 200°C | 200°C | 200°C | 200°C | 200°C |
| T5 | 50°C | 50°C | 50°C | 50°C | 50°C | 50°C |
| R34 | 0.13K/W | 1.04K/W | 7.7K/W | 0.13K/W | 1.04K/W | 7.7K/W |
| R45 | 8.3K/W | 8.3K/W | 8.3K/W | 2.8K/W | 2.8K/W | 2.8K/W |
| Q1 + Q2 | 4.3W | 4.0W | 5.0W | 4.3W | 4.0W | 5.0W |
| T4 | 198.2°C | 187.0°C | 147.8°C | 193.9°C | 162.4°C | 100.3°C |

THERMAL RESISTOR, SEMICONDUCTOR DEVICE USING THE SAME, AND ELECTRIC DEVICE

TECHNICAL FIELD

This invention relates to a thermal resistor or a thermally resistive member having an electrical conductivity and a semiconductor device and an electrical device using the same.

BACKGROUND ART

In a conventional semiconductor device disclosed in a patent document 1 for example, it is proposed to provide a layer of electrically insulating epoxy resin powdery paint having a function of a highly thermally insulative insulating sheet or a resinous thermal resistor on a surface portion of a thermally conductive electrically insulating spacer on which the element is disposed excluding the area where a semiconductor element is attached under pressure.

On the other hand, in an electrical device such as a semiconductor device having a heat generating electrical element and a housing including a heat dissipating substrate for supporting the heat generating electrical element and dissipating heat from the heat generating electrical element and a housing cover surrounding the heat generating element, the housing is required to have a heat resistance. When the heat generated is relatively of small amount and a relatively low temperature can be maintained due to the heat dissipation through the heat dissipation substrate, a heat resistant resin such as PPS can be used for the housing, thereby maintaining the housing cost low.

Also, in the conventional electrical device, as disclosed in Patent document 2, for example, nothing is inserted between the semiconductor device and a copper plate (bus bar) for electrical connecting an electric motor and a capacitor.

In the inverter constructed using the power module disclosed in this document, one module includes output terminals for U-phase (or V-phase, W-phase), P-phase, N-phase and a control terminals, and three modules constitute the inverted. U-, V- and W-phases are connected to an electric motor, P-, N-phase are connected to a smoothing capacitor, an electric source or a converter. The control terminal is connected to a gate driver for controlling the operation of the module.

Patent document 1: Japanese Patent Laid-Open NO. 9-219970
Patent document 2: Japanese Patent Laid-Open NO. 11-265969

DISCLOSURE OF INVENTION

Problems to be Solved by the Invention

A thermal resistor made of resin such as disclosed in Patent document 1 cannot be employed when the semiconductor element temperature exceeds the heat resistant temperature of the resin thermal resistor. Also, when the electrical device is enclosed by a housing, the housing temperature exceeds the heat resistant temperature, so that the housing needs to be made of an expensive heat resistant material such as ceramics, posing a problem that the manufacturing cost of the semiconductor device becomes high.

Also, the electric current and voltage outputted from the semiconductor device are supplied through electrodes to a gate driver and a capacitor (components electrically connected to the semiconductor device). Therefore, the heat from the semiconductor device flows through the electrode into the gate drive and the capacitor. It was also a problem that the electrode is typically at the temperature close to the semiconductor element temperature, so that the temperature of the gate driver and the capacitors may exceed the heat resistant temperature.

While the typical heat resistant temperature of the present silicon element is 125° C., recent development of a module structure (particularly, solder portion) and adapt of a silicon element enable a development of a module that can be used at 150° C. or in some case 200° C. In such case, the heat of the element is transmitted to the surrounding components via a copper plate (bus bar). It was also a problem that the operating temperature of the element is limited by the surrounding components such as capacitors, which are particularly weak against heat.

Accordingly, the object of the present invention is to provided a semiconductor device that is heat resistant, inexpensive and reliable by realizing an inexpensive metal thermal resistor structure, and to provide a thermal resistor suitable for use in a heat generating electric device in general including a semiconductor device.

Measure for Solving the Problem

The thermal resistor according to the present invention comprises a metal member that is arranged to be brought into a partial contact with a contact surface and define an air gap therebetween.

Also, the thermal resistor according to the present invention comprises a stack of a plurality of metal member that are arranged to be brought into a partial contact with each other and define an air gap therebetween.

Also, the semiconductor device according to the present invention comprises a semiconductor element, a housing for enclosing said semiconductor element, said housing including a heat dissipating substrate supporting said semiconductor and dissipating heat generated from said semiconductor and a housing cover connected to said heat dissipating substrate, and a thermal resistor inserted between said semiconductor element and said housing cover or between said heat dissipating substrate and said housing cover, said thermal resistor being a metal member that is arranged to be brought into a partial contact with a contact surface to define an air gap therebetween.

Also, the semiconductor device according to the present invention comprises a semiconductor element, a housing for enclosing said semiconductor element, said housing including a heat dissipating substrate supporting said semiconductor element and dissipating heat generated from said semiconductor element and a housing cover connected to said heat dissipating substrate, and a thermal resistor inserted between said semiconductor element and said housing cover or between said heat dissipating substrate and said housing cover, said thermal resistor being a stack of a plurality of metal members that are arranged to be brought into a partial contact with each other and define an air gap therebetween.

Also, the electrical device according to the present invention comprises a semiconductor device, a component electrically connected to said semiconductor device, an electrically conductive component having an electrical conductivity for electrically connecting said semiconductor device and said component, and a thermal resistor inserted between said semiconductor device and said electrically conductive component or between said electrically conductive component and a component electrically connected to said semiconductor device, said thermal resistor being a metal member that is arranged to be brought into a partial contact with a contact surface to define an air gap therebetween.

Also, the electrical device according to the present invention comprises a semiconductor device, a component electrically connected to said semiconductor device, an electrically conductive component having an electrical conductivity for electrically connecting said semiconductor device and said component, and a thermal resistor inserted between said semiconductor device and said electrically conductive component or between said electrically conductive component and a component electrically connected to said semiconductor device, said thermal resistor being a stack of a plurality of metal members that are arranged to be brought into a partial contact with each other and define an air gap therebetween.

Also, the semiconductor device according to the present invention has a connection portion to be electrically connected to a component, and said connection portion includes a thermal resistor made of a metal member that is arranged to be brought into a partial contact with a contact surface of the component and define an air gap therebetween.

Also, the semiconductor device according to the present invention has a connection portion for an electrical connection, and said connection portion includes a thermal resistor which is a stack of a plurality of metal member that are stacked to be brought into a partial contact with each other and define an air gap therebetween.

Advantageous Results of the Invention

According to the present invention, a thermal resistor that is a metal member that is arranged to be brought into a partial contact with a contact surface and define an air gap therebetween is provided.

Also, the thermal resistor according to the present invention comprises a stack of a plurality of metal member that are arranged to be brought into a partial contact with each other and define an air gap therebetween, so that it is high in heat resistance and electrical conductivity. Also, in the semiconductor device, the heat transmission from the semiconductor element to the housing can be suppressed by the insertion of the thermal resistor made of a plurality of metal materials. This results in the improved reliability of the semiconductor device and that the use of a housing made of a heat resistant resin even when the semiconductor element is operated at a high temperature, enabling the cost reduction.

Also, according to the thermal resistor of the present invention, when the heat generating element is a semiconductor element, the heat flow into the gate drive and the capacitors (components electrically connected to the semiconductor device) can be suppressed, allowing the realization of a system that is improved in cost and reliability.

BEST MODE FOR CARRYING OUT THE INVENTION

Embodiment 1

Figure 1:
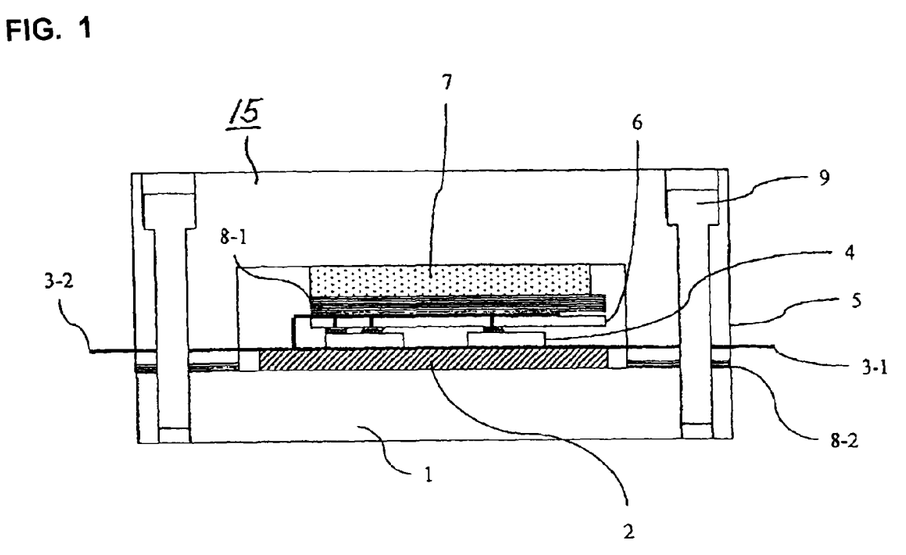
FIG. 1 is a schematic sectional view showing the thermal resistor of the present invention and the semiconductor device using the same (Embodiment 1).

FIG. 1 is a schematic sectional view showing a semiconductor device according to Embodiment 1 of the present invention. Stacked on a heat dissipating substrate (heat spreader) 1 made of metal and forming a stack are an electrically insulating substrate on which copper pattern is disposed (DBC substrate: Direct Bond Copper substrate) 2, a semiconductor element 4, an interposer 6, a thermal resistor 8-1 and a pressing member 7, and this stack is covered with a housing cover 5 made of a heat resistive resin (PPS), and the housing cover 5 is secured to the heat dissipating substrate 1 by screws 9, thereby the whole stack including the semiconductor element 4 is held under pressure. The heat dissipating substrate 1 and the housing cover 5 together constitute a housing 15 enclosing the semiconductor element 4 which is a heat generating element of an electric device. The pressing member 7 is made of a heat resistive rubber for a low cost, the heat resistive rubber having an elasticity and functioning as a pressure spring. The copper pattern (not illustrated) formed on the insulating substrate 2 is joined or pressure bonded to electrodes 3-1, 3-2 extending through the housing 15, providing a voltage application and electrical conduction through these electrode 3-1, 3-2. The electrode 3-1 provides a heat flow via the pattern route makes the temperature equal to or lower than the heat resistive temperature of the housing.

Figure 2:
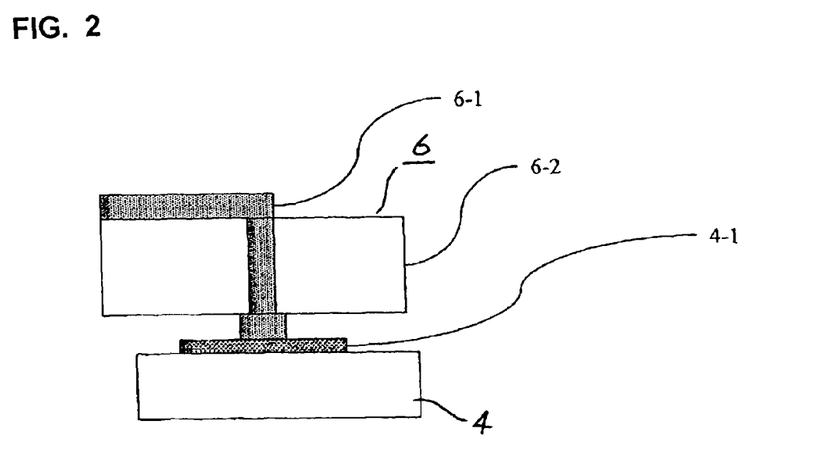
FIG. 2 is an enlarged schematic view of the contacting portion between the interposer and the semiconductor element of FIG. 1 (Embodiment 1).

FIG. 2 shows an enlarged view of the contact portion between the interposer 6 and the insulating body 6-2 (ceramic substrate). The interposer 6 comprises an electrical insulator 6-2 (ceramic substrate) and a copper pattern 6-1. The copper pattern 6-1 is pressure contacted to the electrode 4-1 disposed on the semiconductor element 4.

According to the present invention, the thermal resistor 8-1 is inserted between the top wall portion of the housing cover 5 and the semiconductor element 4, with the pressing member 7 interposed therebetween. With a thermal resistor is inserted between the heat dissipating substrate 1 and the housing cover 5, heat conduction to the housing cover 5 can be prevented.

The thermal resistors 8-1 and 8-2 are inserted at least between the semiconductor element 4 which is a heat generating element and the housing cover 5-1 and are a stack of a plurality of metal plates stacked to be brought into partial contact with each other to define an air gap. Such the thermal resistors 8-1 and 8-2 may be metal plates each having projections and recesses, such as a plurality of folds, stacked with their folds intersecting with each other. The metal plates may preferably be copper, but may be a metal material having a lower thermal conductivity, such as stainless steel, Fe, Mo, W and alloys including them.

Figure 3:
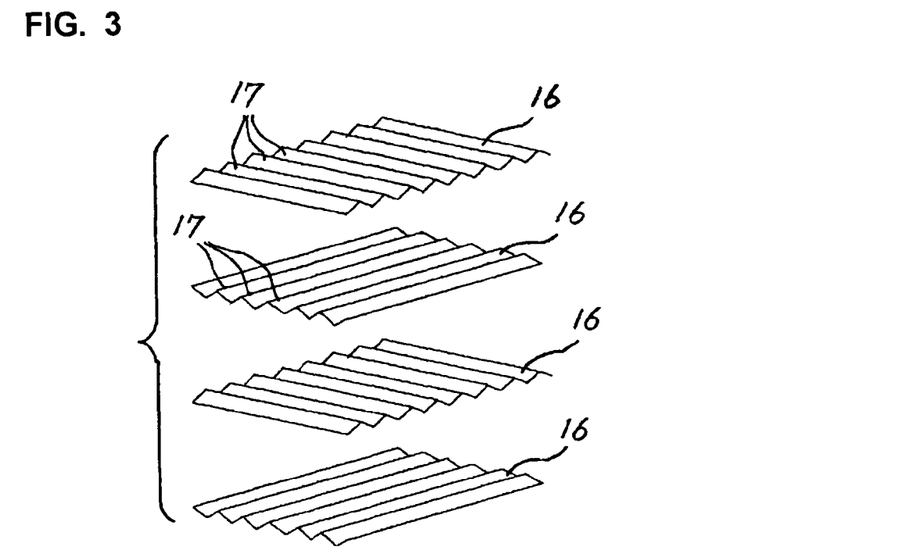
FIG. 3 is an exploded perspective view showing the metal plate constituting the thermal resistor shown in FIG. 1 (Embodiment 1).

One example of a concrete structure for the thermal resistors 8-1 and 8-2 is as shown in FIG. 3 in which each of thin metal plates 16 of 0.3 mm, for example, is provided with a plurality of parallel folds 17, and the metal plates are stacked in a rotated relationship with respect to the adjacent metal plate 16 to be stacked with their folds 17 arranged not in parallel but to intersect with each other. In the illustrated example, the folds 17 are intersecting with each other at right angles and the backs of the folds 17 of the adjacent metal plates 16 are slightly plastically deformed and brought into contact only at those portions, thus making a substantial point contact. Therefore, from the view point of the thermal conductivity, the thermal insulation between the metal plate 16 and the metal plate 16 is made extremely high. It is to be noted that the angle of rotation of the metal plate 16 is not needed to be 90° because the purpose of this is to minimize the contact area, Each of the metal plates 16 are electrically conductive, so that the stack made of the metal plates contacting with each other is electrically conductive as a whole.

Figure 4:
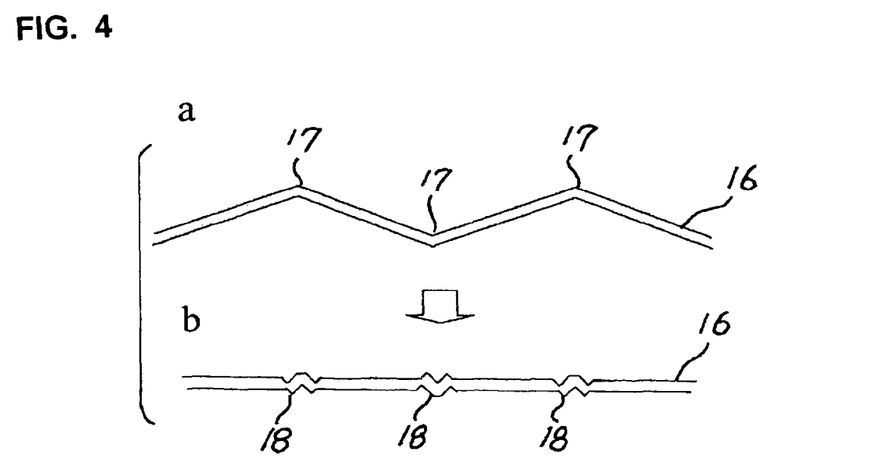
FIG. 4 is a schematic sectional view showing the metal plate of FIG. 3 and how it is deformed when pressed (Embodiment 1).

FIG. 4 illustrates the configuration (FIG. 4b) of the accordion-folded metal plate 16 (FIG. 4a) similar to that shown in FIG. 3 when it is pressed in the vertical direction between two flat plates (not shown). When the stacked metal plates 16 is pressed by the pressing member, the folded metal plates 16 never return to the original flat configuration, but remains in the configuration just like with a projections 18 due to the plastic deformation at the folds (in the vicinity of the backs of the folds 17) at the folded portions as shown in FIG. 4b.

Figure 5:
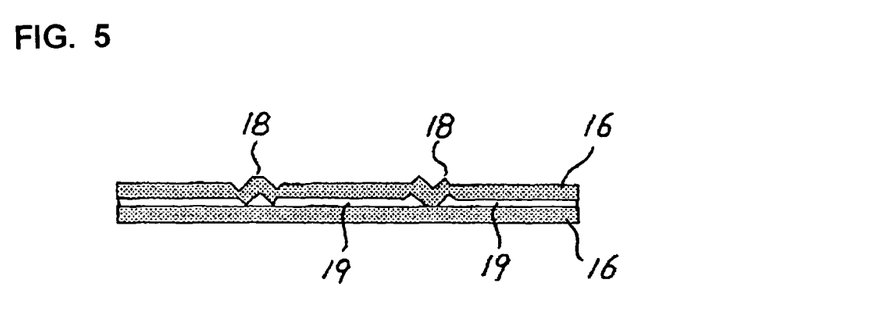
FIG. 5 is schematic enlarged view of the contact portion between the metal plates of FIG. 3 stacked under pressure with their folds intersecting at right angles (Embodiment 1).

FIG. 5 is an enlarged view of the contact portion between the metal plates 16 stacked under pressure in the stacked direction with their folds rotated by 90° in a plane of the major surface of the metal plate 16 in order to reduce the contact area of the contact portion between the metal plates 16. The contact between the projection portions 18 of the metal plates 16 occurs only at the intersecting portions between the backs of the folds 17, those portions being subjected to a slight plastic deformation, and other portions are separated from each other to define an air layers 19 therebetween.

According to the above described structure, the heat transmitted from the semiconductor element 4 to the housing cover 5 can be suppressed by the inserted thermal resistors 8-1, 8-2, so that the temperature of the housing cover 5 or the pressing member 7 made of an organic material can be suppressed not exceeding the heat resistive temperature. Therefore, the housing temperature can be lowered and semiconductor device can be reliable and low cost. Also, the thermal resistor can be also used as an element for applying an elastic pressing force onto the heat generating electric device, whereby the semiconductor device structure can be made simple in structure and low cost. Further, the temperature rise of the electrode can be suppressed, allowing the temperature rise of the peripheral circuit such as the capacitor, driver and the like connected to the electrodes can be suppressed, thus a lower cost and a higher reliability as a system can be realized.

Figure 6:
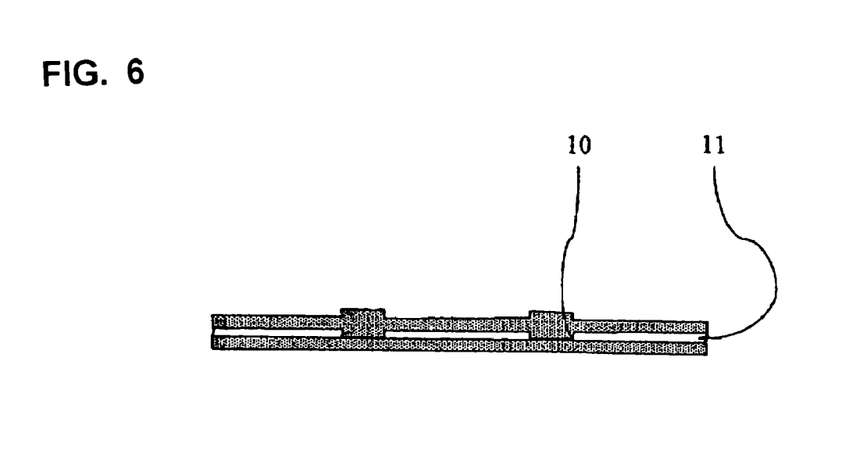
FIG. 6 is a model diagram illustrating the contact portion of FIG. 5 in the form of a model (Embodiment 1).

FIG. 6 is a model diagram illustrating the contact portion of FIG. 5 in the form of a model for an easy thermal analysis (Embodiment 1). The metal plates 16 are modeled by the contact portion 10 and the air layer 11. Also, the thermal insulation due to thickness of the metal plate 16 is so small that it is not taken into consideration.

The thermal permeability needed in the thermal resistor is calculated under the following conditions:

semiconductor element temperature 300° C., ambient temperature 50° C.

the pressing member (heat resisting rubber: Shinnetsu Kagaku KE-1833) 0.005 m; heat conductivity 0.20 W/mK housing thickness (PPS resin) 0.01 m, thermal conductivity 0.20 W/mK pressing member heat-resisting temperature 230° C., housing heat-resisting temperature 200° C. (pressing member has a higher heat-resisting temperature and having a function of a thermal insulating material)

thermal conductivity from housing to ambient air 15 W/m²K it is assumed, for simplification of the discussion, that the interposer connected to the semiconductor element is at a temperature of 300° C. the same as the semiconductor element and the heat-resisting rubber, the thermal resistor and the interposer have the same heat transmitting area S.

The thermal resistance Rtot from the semiconductor element (interposer) and the ambient air, calorific value $\Delta Q$, the maximum temperature of the heat-resisting rubber 230° C., the thermal resistance R4 of the thermal resistor (formed by a plurality of metal plates) should satisfy the following equations. The thermal resistances at the contact portion between the housing and the pressing member as well as the pressing member and the thermal insulating member have large heat transmission area S and the thermal resistances are small, so that they are not taken into consideration.

$$R\text{tot} = R1 + R2 + R3 + R4$$

$$\Delta Q \times R\text{tot} = 250 K (= 300 - 50)$$

$$R4 \times \Delta Q = 70 K (= 300 - 230)$$

R1: housing-ambient air thermal resistance 0.067 (=1/15)×1/S

R2: housing thickness thermal resistance 0.050 (=0.01/0.20)×1/S

R3: pressing member thermal resistance 0.025 (=0.005/0.20)×1/S

Therefore, by making the heat conduction (1/(R4×S)) of the thermal resistor equal to or less than 18.2 W/m² K, the heat resisting temperature of the heat-resisting rubber of 230° C. and the heat resisting temperature of equal to or less than 200° C. can be satisfied (ΔQ=1271 W/m²).

Here, the temperature increase ΔT when a heat of ΔQ [W] flows through a matter of thermal conductivity k [W/mK] and length Δl [m];

$$\Delta T = \Delta Q \times \Delta l / (k/S) = \Delta Q \times R; \text{ and}$$

the temperature increase ΔT of the inter-matter interface having the heat permeability h;

$$\Delta T = \Delta Q \times \Delta l / (k/S) = \Delta Q \times R$$

are used.

While the heat-resisting temperature of metal is generally higher than that of the organic material, but the thermal conductivity is also high. For example, even with stainless steel of which thermal conductivity is relatively low (thermal conductivity: 16 W/mK, thickness: 8 mm), the thermal permeability is 2000 W/m²K (=16/0.008), not satisfactory for the thermal resistor for solving the problem to be solved by the present invention. Therefore, such metal material as it is cannot be used as a thermal resistor.

As one example for explaining the advantageous results of the present invention, the thermal permeability between metal plates will be calculated under the following conditions.

distance between folds: 2 mm pitch
contact portion area: 0.1×0.1 mm²
air layer thickness (=height of the contact portion): 0.1 mm
metal plate thickness: 0.3 mm
air thermal conductivity: 0.023 W/mK
thermal conductivity of metal plate: 400 W/mK
thermal conductivity of metal plate contact portion: 4000 W/m²K (see Int. J. Heat Transfer 41 (1998)3475)

With average thermal permeability of the contact portion expressed as have, the following relationship is obtained:

$$h\text{ave}=1/(R\text{ave}\times 0.002 \times 0.002)$$

$$R\text{ave}=1/(1/R5+1/R6)=1044$$

$$R5=0.001/(0.023\times(0.002\times 0.002-0.0001\times 0.0001))\\=1090$$

$$R6=1/(4000\times 0.0001\times 0.0001)=25000$$

where,

Rave: average contact thermal resistance between the metal plates
R5: air layer thermal resistance between the metal plates
R6: contact portion thermal resistance between the metal plates.

Therefore, the average thermal conductivity is 239 W/m²K. Thus, since the thermal permeability of the air layer thickness (=contact portion height) of 0.1 mm is 230 W/m²K (=0.023/0.0001), it is understood that the thermal permeability at the contact portion between the metal plates is made sufficiently small by the reduction of the contact area. From these results, it is understood that the thermal conductivity of 18.2 W/m²K or less can be realized by stacking 14 (=239/18.2) or more metal plates. Using the metal plates of 0.3 mm, a desired thermal resistor can be constructed with a thickness of 5.6 mm ((0.3+0.1)×14), or a thermal resistor of the thermal conductivity of 0.10 W/mK (=18.2×0.0056).

When the temperature of the heat dissipating substrate (heat spreader) 1 becomes higher than the heat-resisting temperature of the housing cover 5, the thermal resistor 8-2 made of a plurality of metal plates may be inserted between the heat dissipating substrate 1 and the housing cover 5, thereby to reduce the temperature of the housing cover 5 equal to or lower than its heat resisting temperature.

While the thermal resistor of the present invention is effective when used in a semiconductor device, it is also applicable to a portion where a thermal resistor having a high heat resistance and electrical conductivity is required. Since the thermal resistor has an electrical conductivity, it is applicable to general electrical devices.

According to the present invention, the heat conduction from the semiconductor element to the housing can be suppressed. As a result, the semiconductor device can be improved in reliability. Also, an inexpensive resin housing can be used even when the semiconductor device is operated at a temperature at or above the heat resisting temperature of the resin housing.

Embodiment 2

Figure 7:
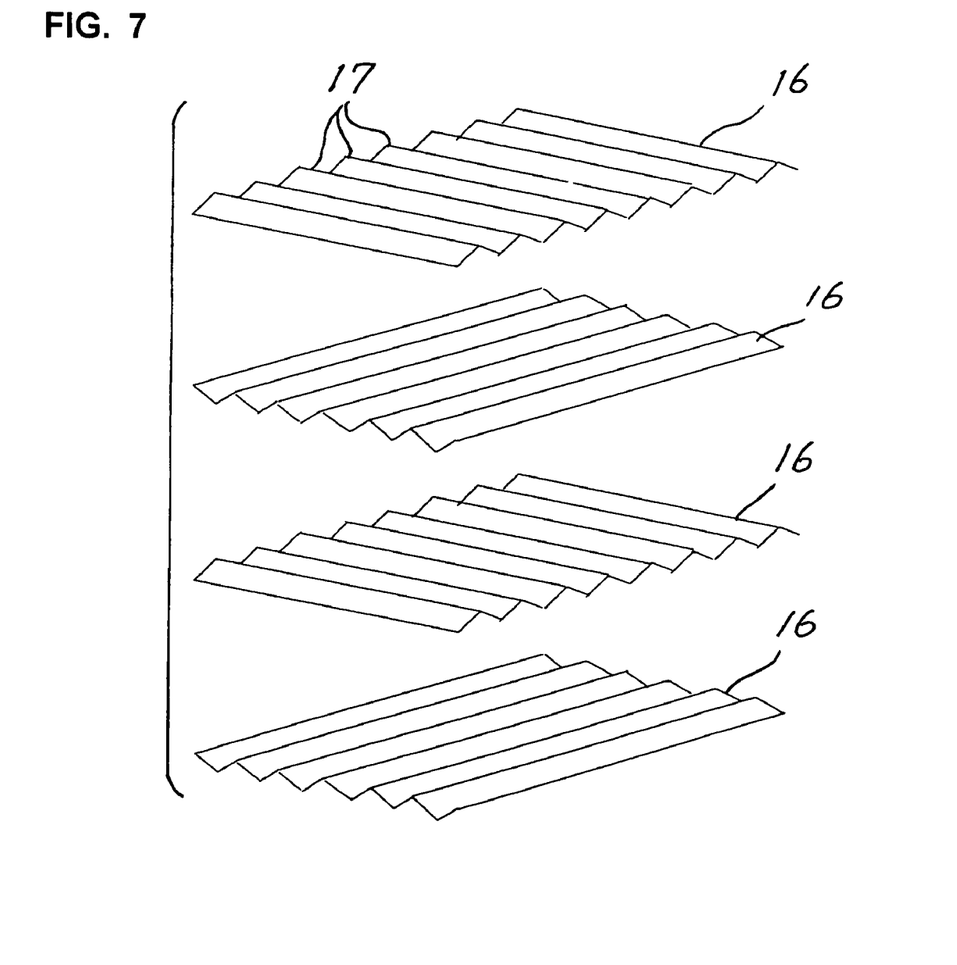
FIG. 7 is a schematic perspective view showing the folded thermal resistor of the present invention (Embodiment 2).

Next, in connection with the embodiment using the thermal resistor shown in FIG. 7, a structure in which a function of the pressing member is added to the thermal resistors 8-1 and 8-2 will be considered. With the metal plates 16 having a thickness of 1 mm and alternatingly rotated and stacked, the metal plates 16 of the thickness of 1 mm does not become flat as shown in FIG. 4b due to plastic deformation, the thermal resistors 8-1 and 8-2 exhibit the function of leaf springs. That is, each of the metal plates 16 becomes to the state shown in FIG. 7, being a spring-like configuration having folds and a relatively large thickness, whereby the stack of the metal plates 16 as a whole exhibits an elasticity in the direction of stack.

As one example for explaining the advantageous results of the present invention, a thermal permeability of the contact portion of the spring-like stack in which the metal plates 16 of 1 mm thick folded as shown in FIG. 7 are alternatingly rotated in the major plane by 90° and stacked with each other will be calculated under the following conditions through the use of a model similar to that shown in FIG. 6.

| | |
|---|---|
| metal plate thickness: | 1 mm |
| fold distance: | 5 mm pitch |
| contact portion area: | 0.3 × 0.3 mm² |
| air layer thickness: | 0.3 mm | air thermal conductivity and true thermal conduction of the contact portion are similarly calculated as done for the metal plates.

With the average contact portion thermal conduction hsp between the metal plates, the following relationships are obtained.

$$hsp=1/(Rsp\times 0.005\times 0.005)$$

$$Rsp=1/(1/R7+1/R8)=441$$

$$R8=0.003/(0.023\times(0.005\times 0.005-0.0003\times 0.0003))\\=524$$

$$R9=1/(4000\times 0.0003\times 0.0003)=2778$$

where,

Rsp: average contact thermal resistance
R7: air layer thermal resistance
R8: contact thermal resistance at actually contacting area.

The average thermal permeability hsp between the metal plates 16 is 91 W/m²K, and a thermal resistor having a desired thermal resistance can be obtained by stacking 6 spring-like metal plates 16 (=91/18.2) with the direction of folds alternatingly changed by 90.

It is to be noted, since the thermal resistor has a function of a spring, that a metal plate may be inserted between the pressing member 7 and the thermal resistor 8-1. In that case, the pressing member 7 has only a function of a spacer between the housing cover 5 made of resin and the thermal resistor 8-1.

Also, the thermal resistor 8-1 has a function of a spring, so that the pressing member 7 which functions as a spring in FIG. 1 can be removed. In that case, too, insertion of a metal plate (thickness of the order of 0.1-1 mm) of SUS, Mo, Al, W, Fe, Ni, Zn or the like is desirable from the view point of improved rigidity. When the pressing member functioning as a thermal resistor is removed, it is necessary to increase the number of metal plates 16 to be inserted.

Next, the number of the metal plates 16 needed for the thermal resistor 8-1 when the pressing member 7 is removed.

$$R2tot=R11+R12+R14$$

$$\Delta Q2 \times R2tot=250K(=300-50)$$

$$R14 \times \Delta Q2=100K(=300-200)$$

R11: thermal resistance between housing cover and ambient air: 0.067 (=1/15)×1/S
R12: thermal resistance across thickness of housing cover: 0.050 (=0.01/0.20)×1/S
R14: thermal resistance of the thermal resistor Accordingly, the heat resisting temperature of 200° C. or below for the housing can be obtained by making the thermal permeability (=1/(Rtot×S)) of the thermal resistor 8-1 equal to or less than 12.9 W/m². The thermal permeability hsp between the metal plates 16 is 91 W/m²K, the desired thermal resistor 8-1 can be realized by stacking 8 springs (=91/12.9) alternatingly rotated.

In this semiconductor device, similarly to the embodiment 1 previously explained, the heat transmission from the semiconductor element 4 to the housing cover 5 can be suppressed, the reliability of the semiconductor device is improved, and an inexpensive resin cover member can be used even when the semiconductor operates at a temperature above the heat-resisting temperature of the resin housing cover. In this embodiment, the thermal resistors 8-1 and 8-2 have elasticity, so that they can be used as means for applying a pressing force for pressing the semiconductor element 4, and the pressing member can be made a simple spacer, small-sized or eliminated.

Embodiment 3

Figure 8:
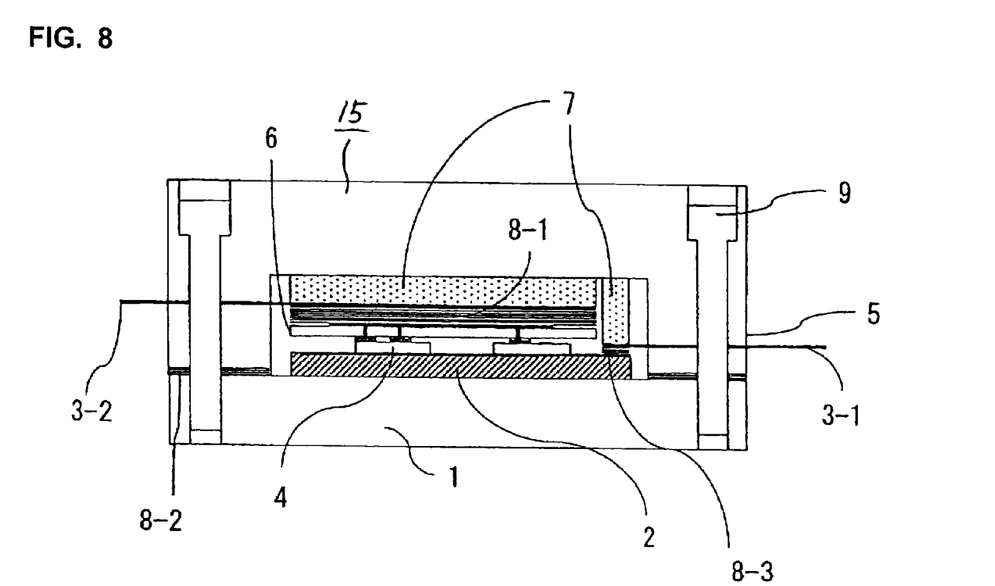
FIG. 8 is a schematic sectional view showing another semiconductor device of the present invention (Embodiment 2).

In the embodiment of the present invention shown in FIG. 8, since the thermal resistor is made of copper, the thermal resistor itself is used as an electrode having a high thermal resistance as compared to the single metal member in spite of a good electrical conductivity. Here, the semiconductor element 4 has the interposer 6, the thermal resistor 8-1, the electrode 3-2 and the pressing member 7 stacked thereon in the named order to constitute a stack, and this stack is enclosed by the housing cover 5. Also, the insulating substrate 2 has disposed on its copper patterns a stack of the thermal resistor 8-3, the electrode 3-1 and the pressing member 7 stacked in the named order, and this stack is enclosed by the housing cover 5. The electrodes 3-1 and 3-2 are joined to the electrode terminals (not shown) of the capacitor and the gate driver at the exterior of the semiconductor device. A similar thermal resistor 8-1 is inserted also between the semiconductor element 4 and the electrode 3-1 on the heat dissipating substrate 1. The electrodes 3-1 and 3-2 are joined to the electrode terminals (not shown) of the capacitor and the gate drive at the exterior of the semiconductor device. Here, since the thermal resistors 8-1 and 8-2 are inserted between the electrodes 3-1, 3-2 and the semiconductor element 4, the electrode temperature of the semiconductor device becomes lower than the electrode temperature of the conventional structure. Therefore, the flow of heat from the semiconductor element 4 to the capacitor and the gate driver can be suppressed. A large electric current does not flow through the gate electrode in particular, so that it is applicable even when the electrical resistance at the contact portion is high between the metal plates and the metal spring.

Embodiment 4

It is to be noted that the insertion of the above-discussed thermal resistor having the electrical conduction between the electrode connected to the heat generating electrical element in the semiconductor device and the electrical device such as the capacitor or the gate driver brings provides similar advantageous results. In this case, the thermal resistor having an electrical conductivity is mounted to the outside of the semiconductor device, and it is possible to improve the reliability and reduce the cost of the electrical device as a whole. The thermal resistor may be either inserted between the electrode of the semiconductor device and the conductor connecting the electrical device, between the conductor and the electrical device or between the separated conductor sections.

Figure 9:
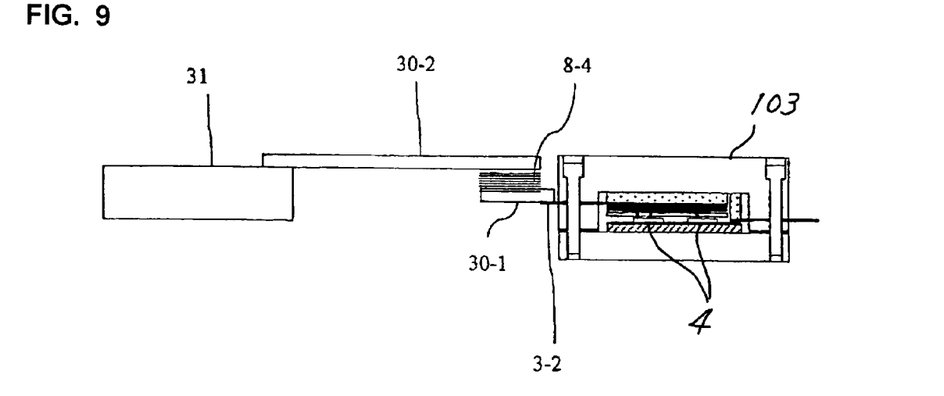
FIG. 9 is a schematic sectional view showing still another semiconductor device of the present invention (Embodiment 3).

FIG. 9 shows an embodiment in which the thermal resistor 8-4 of the present invention is inserted between the separated conductor sections. The electrode 3-2 of the semiconductor module 103 is connected to the capacitor 31 via the copper plate 30-1, the thermal resistor 8-4 and the copper plate 30-2. When the thermal resistor 8-4 is not inserted and the copper plates 30-1 and 30-2 are brought into a surface contact with each other, the temperature of the copper plate becomes close to the temperature of the electrode. Therefore, the semiconductor element 4 is at a high temperature and when the electrode temperature rises to 200° C. (the heat-resisting temperature of the module housing), the heat flows from the semiconductor element 4 to the capacitor 31, so that the capacitor 31 is heated to a temperature significantly above its heat-resisting temperature (such as 100° C.). In this embodiment, that flow of heat is suppressed by the insertion of the thermal resistor 8-4.

Figure 10:
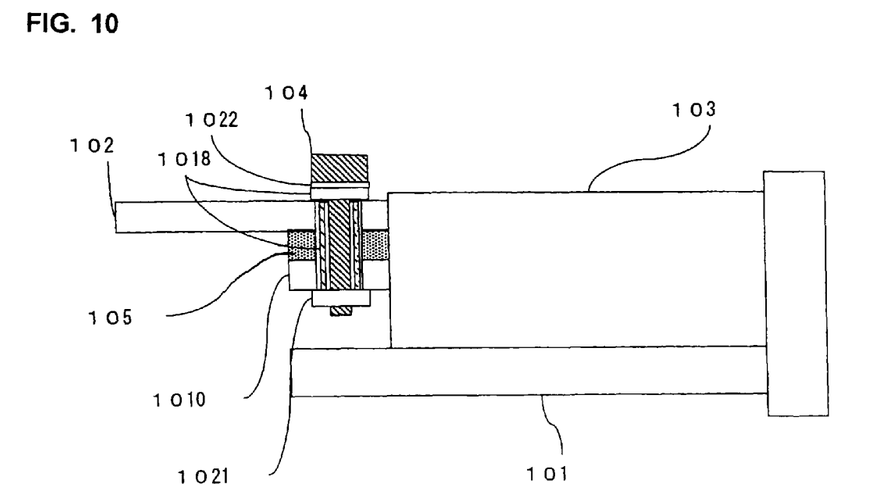
FIG. 10 is a detailed view of the electrode portion and it surroundings of the semiconductor device of FIG. 9 (Embodiment 3).

FIG. 10 shows the details of the electrode portion of the semiconductor module 103 shown in FIG. 9. The semiconductor module 103 on a heat sink base plate 101 has an electrode terminal 1010 projected therefrom, to which a copper plate 102 which is a connection conductor is attached by a screw 104 via a thermal resistor 105 which has an opening. The thermal resistor 105 is made of metal and has an electrical conductivity and also has a function of suppressing the heat conduction from the electrode terminal 1010 to the copper plate 102. In this embodiment, a thermally insulating material 1018 is inserted between the screw 104 and the copper plate 102 in order to prevent the heat from conducting from the electrode terminal 1010 to the copper plate 102 via the screw 104 contacting with the copper plate 102, the electrode terminal 1010 and the like. The thermally insulating material 1018 is not required to have an electrical conductivity, so that it may be a ceramic material or it is possible to use the thermal resistor of the present invention. Also, in order to apply the load evenly, a washer 1022 is inserted between the screw 104 and the thermally insulating material 1018.

Embodiment 5

Figure 11:
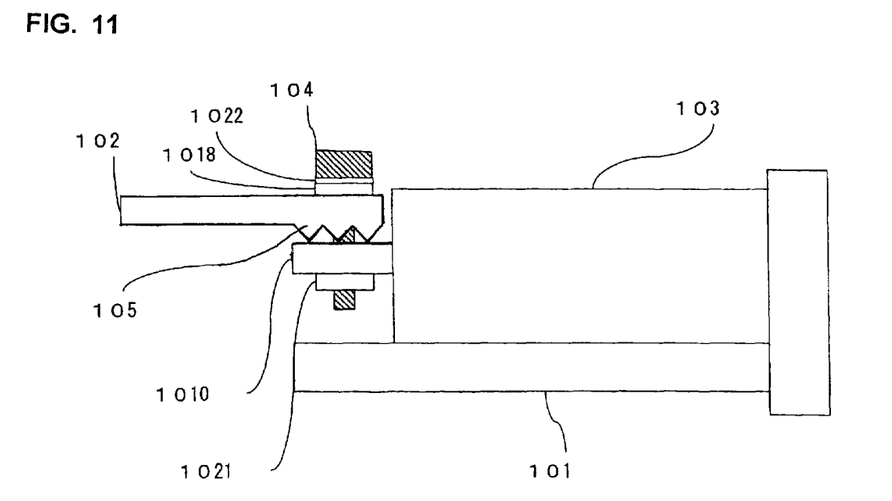
FIG. 11 is a detailed view of the electrode portion and its surroundings of another semiconductor device of the present invention (Embodiment 4).

FIG. 11 shows an example in which the contact portion of the copper plate 102 which is a connecting conductor that contacts with the electrode 1010 has a thermal resistor structure (a structure having a corrugated surface partially contacting with the contact surface to define air gaps between the corrugated and contact surfaces). In the figure, only the copper plate 102 is made into the thermal resistor 8, but similar results of decreasing the temperature of the copper plate 102 can be equally obtained by providing the thermal resistor structure to only the electrode 1010 or to both of the copper plate 102 and the electrode 1010. While the illustrated copper plate 102 has the thermal resistor structure only at the contact portion that contacts with the electrode 1010, the entire copper plate 102 may be provided with the thermal resistor structure.

Oxidization of the thermal resistor 105 operating at a higher temperature may pose a problem. In that case, the oxidization can be effectively prevented by applying the surface the plating, the plating another metal by evaporation deposition, the coating film by the evaporation deposition or the like. When the thermal resistor 105 is a stack as shown in FIG. 7 and each of the metal plates is to be coated, then it is important that the coating material has an electrical conductivity. As for such materials, Ni, Au, Ti, Cr, Cu, Zn, Mo, Ta, W and the like may be used. The coating material may be changed according to the volumetric resistance and the volumetric resistance which depend upon the operating environment, the cost and the system configuration (The thermal resistor itself is a thin metal member, so that it is small in the thermal resistance. Therefore, the thermal resistance and the electrical resistance at the time of operation are determined mainly by the material of the contact portions, i.e., by the thermal conductivity and the volume resistivity of the coating film). Also, an electrical conductivity is established after stacking, particularly, after assembly (after screw tightening), the thermal resistor or surroundings of the thermal resistor, the copper plate, the electrode and the like may be covered by a heat resisting resin or the like to prevent oxidization. Since the electrical conductivity is established, use of an electrically conductive material for the coating film material is not indispensable.

Figure 12:
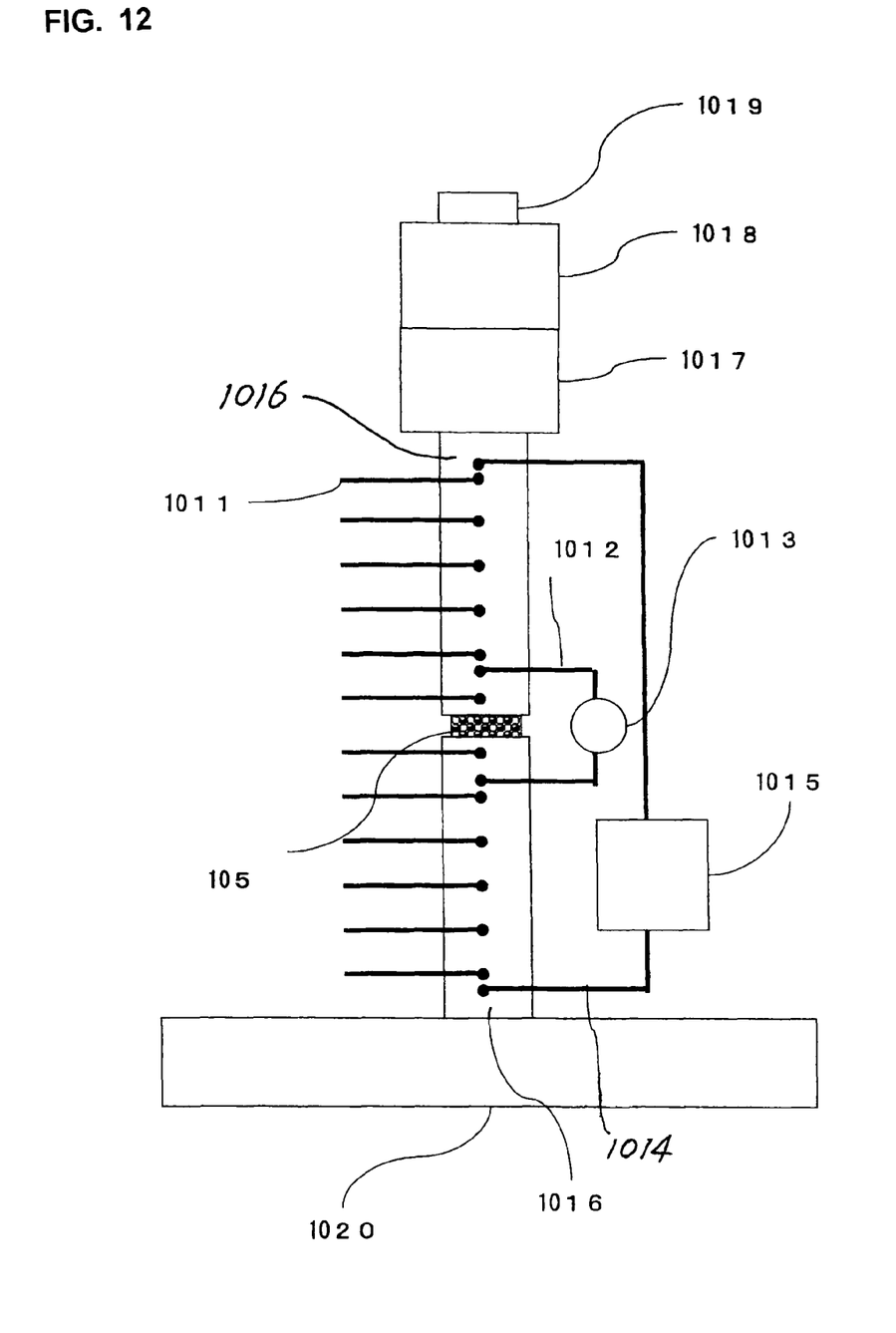
FIG. 12 is a schematic view of the measuring device for measuring thermal insulation and electric resistance of the thermal resistor (Embodiment 1).

While the values for the contact portion heat resistive value for the discussions of Embodiments 1-4 are assumed to be values disclosed in the reference papers, in order to evaluate the performance of the thermal resistor, the measurement of the heat resistance at the contact portion and the electrical resistance of the contact portion of the thermal resistor having the structure shown in FIG. 3 have been conducted by a device illustrated in FIG. 12. The thermal resistor 105 is inserted between the copper rods 1016 (diameter: φ 10 mm) mounted on the water cooling plate 1020.

Disposed on the top of the copper rods 1016 is a copper block 1017 including the heater therein (surrounded by a thermally insulating material), a thermally insulating material 1018 for interrupting the heat from the heater, and a load cell 1019 for measuring the applied pressure and the pressure is added from the top of the load cell. The copper rods 1016 has embedded therein thermo couples 1011 with a longitudinal space between them, so that the temperature differences at the respective positions when the heater is heated may be measured.

Figure 13:
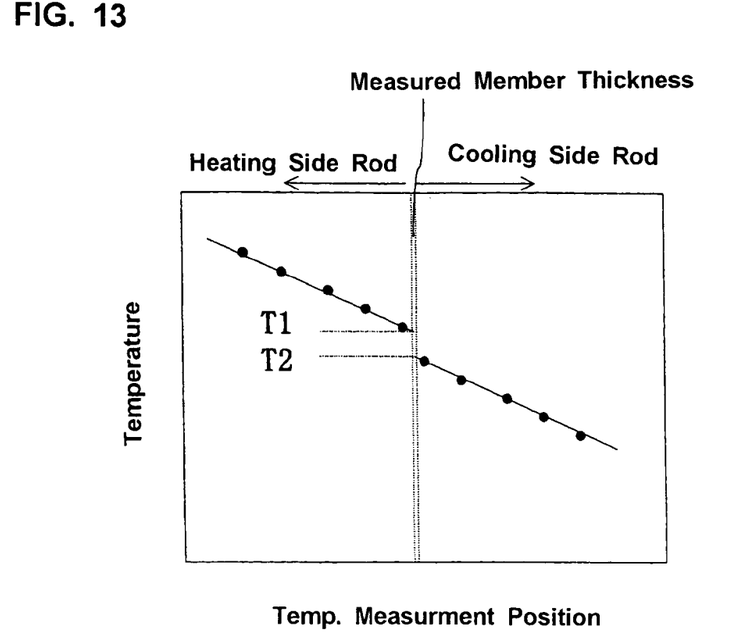
FIG. 13 is a graph showing one example of temperature data obtained by the measuring device of FIG. 12 (Embodiment 1).

FIG. 13 is a graph showing one example of temperature data obtained by the measuring device of FIG. 12 (Embodiment 1). In the graph of FIG. 13, T1 is the temperature on the thermal resistor at the heating side assumed by the extrapolation method from the temperatures of the thermo couples on the heat side, and T2 is the temperature of the thermal resistor at the cooling side assumed by the extrapolation method from the temperature of the thermo couples on the cooling side rod. In FIG. 13, it is assumed that the temperature gradient is dT/dI, the sectional area of the copper rod is S and the thermal conductivity of copper is k, then the calorific value Q is induced by Q=dT/dI×S×k. Therefore, the thermal resistance RT of the thermal resistor is, using Q, RT=(T1−T2)/Q.

Also, in the device shown in FIG. 12, the copper rods 1016 have voltage measuring copper wires 1012 and current terminals (copper wires) 1014 brazed thereto, whereby the electrical resistance of the thermal resistor can be measured by the four terminal method.

Figure 14:
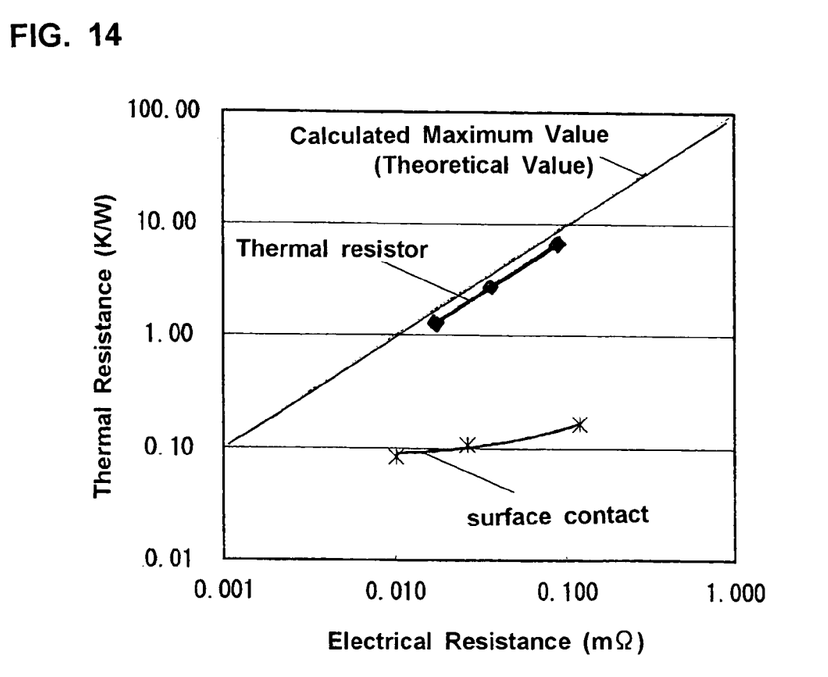
FIG. 14 is a graph showing the relationship between the electric resistance and the thermal insulation of the thermal resistor obtained by the measuring device of FIG. 12 (Embodiment 1).

The electrical resistance and the thermal resistance of the thermal resistors, which were made of one, two or six sheets of folded copper foils in which the sheets are rotated so that the folds are not in parallel to each other but to intersect with each other, were measured by this device. The results are shown in the graph of FIG. 14. The pressure applied to the copper rods of φ 10 mm was 1.8 MPa and the thermal resistor average temperature (as defined by (T1+T2)/2) was 120° C. Also, the contact electrical resistance and the contact thermal resistance of the contact portion, where no thermal resistor was inserted, i.e., the copper rods were in the surface contacting state relative to each other, were measured at the contact temperatures of 80° C., 160° C. and 230° C. The pressure applied to the copper rods was 1.8 MPa. Also, the graph of FIG. 14 indicates the theoretical value (trade off line between the electrical resistance and the thermal resistance) when heat and electricity are conducted only at the contact portion in the surface contacting state without the heat conduction at the air gap portion.

This theoretical value can be calculated by the following method. The thermal resistance RT can be expressed by RT=L/k/S1, where the surface area of the contact portion 10 (tip) is S1 and the length of the contact portion is L. Similarly, the electrical resistance RE can be expressed by RE=ρ×L/S, where ρ is volumetric resistivity.

Therefore, as for copper, Rt (K/W)/Rele (mΩ)=1/(k×ρ×1000)=1/(392×2055 E−8×1000)=100K/W/(mΩ).

In the graph of FIG. 14, the measured relationship of the trade-off of the electrical resistance and the thermal resistance of the thermal resistor is close to the ideal state, indicating that the structure of the thermal resistor of the present invention is a structure that has a large air gap region and suppresses the electrical resistance and increases the thermal resistance. Also, as understood from the graph of FIG. 14, the thermal resistance can be made higher than that of the surface-contacting state by the order of 10 at the same electrical resistance. Further, by stacking, the suitable selection, design and control can be achieved for obtaining optimum electrical and thermal resistances in an electrical device.

It is to be noted that the trade-off line is determined by the relationship of the thermal conductivity k and the volmetric resistivity p of the material of the contact portion The thermal resistance and the electrical resistance that can be actually realized are determined, through the use of the present invention, by the true contact area, and they vary according to the applied pressure and the temperature. Also, the control of the thermal resistance and the electrical resistance can be achieved by stacking as in the present invention, enabling the optimum conditions to be established in terms of the specifications such as current carrying capacity, the copper plate cooling state and the copper plate temperature upper limit.

Figure 15:
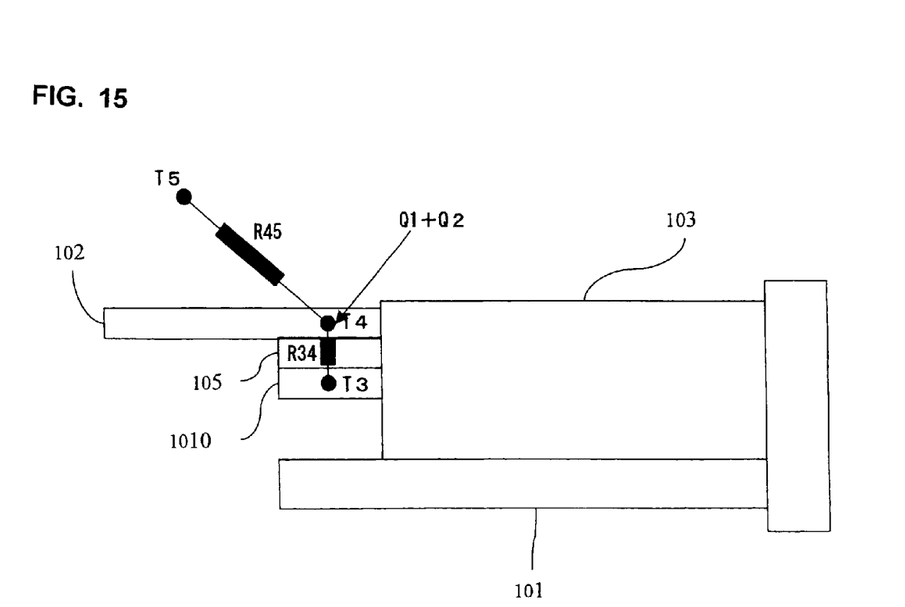
FIG. 15 is a thermal circuit diagram illustrating the relationship between the electric resistance and the thermal insulation of the thermal resistor of the device of FIG. 10 (Embodiment 1).

Using the values obtained by the experiments, the advantageous results of the thermal resistor of the present invention was roughly studied by the thermal circuit diagram shown in FIG. 15. In this thermal circuit diagram, T3 is temperature of the electrode 1010, T4 is temperature of the copper plate 102, T5 is ambient air temperature, Q1 is generated heat at the contact portion, Q2 is generated heat at the copper plate 102, R34 is the thermal resistance between the electrode 1010 and the copper plate 102 and R45 is the thermal resistance of between the copper plate 102 and the ambient air (between the copper temperature T4 and ambient air temperature T5). Q1 and Q2 are treated as being generated at the copper plate 102 for the simplicity of the circuit diagram. In this example of study, there are other optimum values for the electrical resistance and the thermal resistance, but here in which confirmation of the advantageous results is its purpose the experimental values are applied.

The calculations of the temperature of the copper plate 102 were achieved in terms of the temperature where the thermal resistor of the present invention was not used and the contact is surface-contact (condition 1), where the thermal resistor used was made of a single sheet (condition 2), where the thermal resistor was made of six sheets (condition 3), where the thermal resistor of the present invention was not used, the contact surface is surface-contact and the copper plate 102 is cooled by a forced cooling by a fan (condition 4), where the thermal resistor of a single sheet is used (condition 5), and where the thermal resistor made of six sheet is used (condition 6). The calculation conditions were as discussed below.
copper plate length: 0.30 m
copper plate width: 0.020 m
copper plate thickness: 0.001 mm
copper volmetric resistivity: 2055 E−8 Ωm
ambient temperature: 50° C.
electrode temperature: 200° C.
electric current: 100 A
air heat conductivity: 10 W/m2K (natural cooling), 30 W/m2K (forced cooling),
copper plate electrical resistance: 0.00038Ω=2055 E−8 Ωm×0.30 m/(0.001 m×0.020 m)
surface contact portion thermal resistance: 0.13K/W (FIG. 7, 120° C.—interpolation value)
contact portion thermal resistance of a single sheet thermal resistor: 1.04K/W (FIG. 7, 120° C.)
surface contact portion electric resistance: 0.000049Ω (FIG. 7, 120° C.—interpolation value)
thermal resistor electric resistance 0.000016Ω (FIG. 7, 120° C.)

Here, the discussion was made as to the case where the contact portion is at the same temperature (120° C.), and, in the surface contact, the value was interpolated from the data of 80° C., 160° C. and 230° C. The thermal resistor of a single sheet was smaller in the electrical resistance than that of the surface contact and was also small in the generated heat. The reason for this is considered to be that the region of the true contact portion is made wider.

Figure 16:
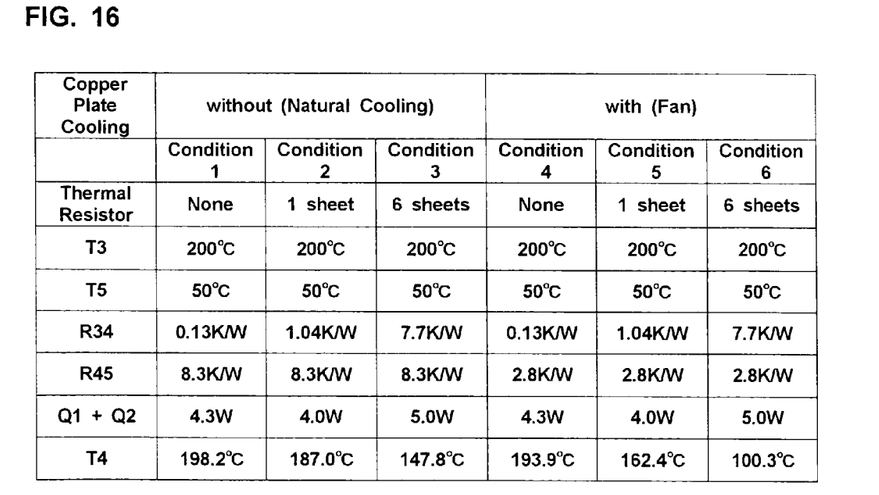
FIG. 16 is a table showing the results of temperature of the copper plate induced from the relationship between the electric resistance and the thermal insulation of the thermal resistor obtained by the device of FIG. 10 (Embodiment 1).

In terms of the case where the copper plate is natural-cooled (conditions 1, 2 and 3) and where the it is cooled by a fan (conditions 4, 5 and 6), the outline of the calculation conditions and the calculation results is indicated in the table of FIG. 16. For example, in condition 1, T3=200° C., T5=50° C., R34=0.13K/W, R45=1/(10 W/m2K×0.30 m×0.020 m×2 (face and back sides))=8.3K/W, Q1+Q2=100 A×100 A×(0.000049Ω+0.00038Ω)=4.3 W. In this case, the temperature T4 of the copper plate 102 is 198.2° C.

The temperatures T4 of the copper plate 102 of the conditions 2-6 in the table of FIG. 16 are all calculated in a similar method. Here, in the case of natural cooling, for example, the temperature T4 of the copper plate 102 with the thermal resistor made of a single sheet or six sheets is decreased from 198.2° C. to 187.0° C. or 147.8° C., respectively. Also, when the copper plate is cooled by a fan, the temperature T4 of the copper plate 102 is decreased from 193.9° C. to 162.4° C. 100.3° C., respectively.

Thus, the thermal resistor of the present invention exhibits an advantageous result even when only one sheet is inserted. Also, by increasing the number of inserted sheets, under the above discussed conditions, the temperature decreasing effect for the copper plates is significant.

While the verification of inserted number of the thermal resistor copper plates is achieved within the range of experiments, both the thermal resistance and the electrical resistance can be increased by increasing the number of insertion. The optimum number of sheets to be inserted is determined by the generated heat amount (that is, electric current and copper plate configuration), heat dissipation amount of the copper plate (depends upon how cooled and the surrounding environmental state), target temperature of the copper plate or the like. Thus, according to the present invention, the controlling the thermal resistance and the electrical resistance of the contact portion into the optimum state for the operating conditions can be inexpensively and easily achieved by increasing the number of insertion of the thermal plates.

Thus, according to this embodiment, the advantageous effects of the previously discussed embodiments are also obtained and an advantageous effect that the feat flow from the semiconductor element to the gate driver or the capacitor is obtained, resulting in that a system of low cost, improved reliability can be realized.

While copper is used as the material for the thermal resistor in the above embodiments, a metal material such as Fe, Mo, W, Ni, Zn or the like having a low heat conductivity and a metal material of an alloy such as SUS for example including the above materials may be used to provide the required functions.

Embodiment 6

Figure 17:
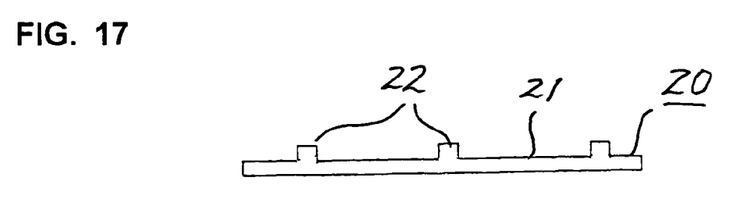
FIG. 17 is a schematic side view showing the thermal resistor by the plating (Embodiment 5).

It is to be noted that the thermal resistor of the present invention may be modified in concrete structure and, as one example, the thermal resistor 20 may be a metal plate 21 having on its surface partially plated layers 22 to define projections and recesses. The configuration of the plated layers 22 may be one that partially brought into contact with the contact surface of the member to be connected and define air gaps therebetween, such as parallel, elongated lines or dot-like shape. Also, the material of the plated layers 22 may be the same as that of the metal plates 21 or different from that of the metal plates 21. Also, they may be either on one face of the metal plates 21 as shown in FIG. 17 or on both faces. Further, only one metal plate 21 having the plated layers 22 may be used and a plurality of the metal plates 21 may be stacked into a stack.

Embodiment 7

Figure 18:
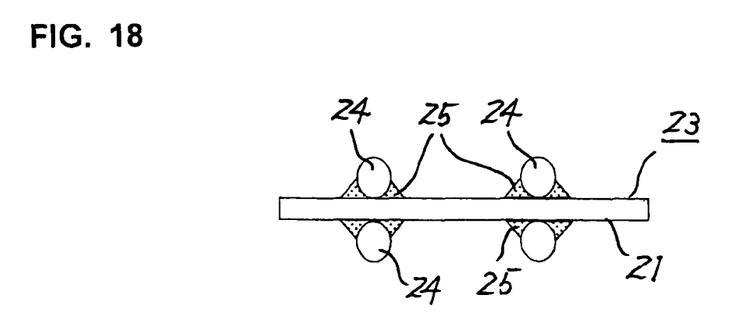
FIG. 18 is a schematic side view showing the thermal resistor in which the metal plate surface has the conductor joined thereon by the brazing, for example (Embodiment 6).

The thermal resistor 23 shown in FIG. 18 is the one in which conductors 24 are joined by the brazing 25 or the soldering on the surface of the metal plate 21. Although not illustrated, it is also possible to make this by another method, such as the connection of very small copper balls to the metal plate 21 by the brazing or the provision of a plurality of juxtaposed coil springs or the combination of these structures.

Embodiment 8

Figure 19:
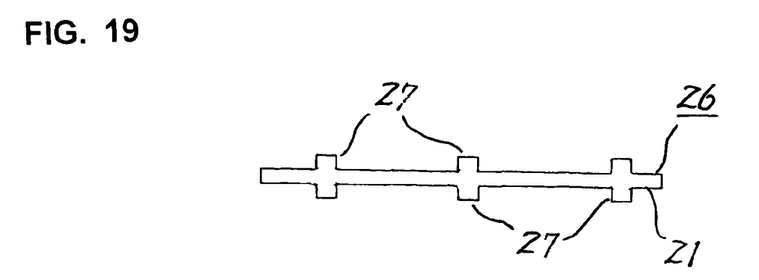
FIG. 19 is a schematic side view showing the thermal resistor in which the metal plate surface has the treatment such as the etching (Embodiment 7).

The thermal resistor 26 shown in FIG. 19 is the one in which the metal plate 21 has in its surface processed to define projections and recesses 27. The treatment is achieved by many processes such as the etching treatment, the plastic deformation by the pressing die including the projections and recesses, the punching of the metal plate to provide projections and recesses, or by the abrasion for providing the projections and recessed.

Embodiment 9

Figure 20:
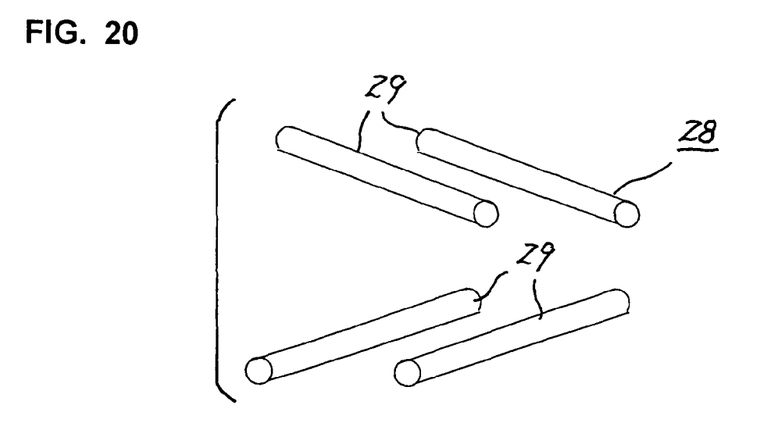
FIG. 20 is a schematic perspective view showing the thermal resistor in which two copper lines are arranged so that their contact portion is a point (Embodiment 8).

The thermal resistor 28 shown in FIG. 20 does not have the metal plates 21 as discussed above, but it has more than two copper wires 29 arranged in parallel and rotated and placed one on the other so that they intersect each other to provide point contacts at the contact portions between them, the arrangement being to be inserted between two members to be connected.

In the thermal resistor it self, the metal plates of the thermal resistor may be manufactured by a suitable method selected from the view points of the manufacture and the costs out of the above discussed various method. Also, in the above discussed examples, parallel projections and recesses are provided by forming folds and the plates, and stacking on the adjacent metal plate such that the projections and recesses are intersecting with each other to provide the structure in which two members are brought into point contact with air gaps defined therebetween, but similar advantageous results can be expected by provided projections of a diameter of 0.1 mm and a height of 0.1 mm for example by the etching or the plating at a predetermined positions and stacking them. At that time, the amount of the deformation of the tip of the projections upon pressing can be minimized by making the configuration of the tips of the projections before pressing acute angle. This provides a suppressed increase of the electrical resistance and a higher heat insulating effect.

Also, the thermal resistor 8-1 may be a thermal resistor which is a metal member as shown in FIG. 3 or FIG. 7 for example in which a single sheet of metal plate 16 having the folds 17 is used for making partial contacts with the contact surface for defining air gaps therebetween, or may be a thermal resistor which is an integral part defined by projections and recesses formed at the contact portion with which it contacts with the electrode of the conductor which is a metal member.

Also, while copper is used as the material for the thermal resistor in the above embodiments, a metal material such as Fe, Mo, W, Ni, Zn or the like having a low heat conductivity and a metal material of an alloy such as SUS for example including the above materials may be used to provide the required functions.

It is to be noted that while the thermal resistor of the present invention is effective when used in a semiconductor device, it is also applicable to a portion where a thermal resistor having a high heat resistance and electrical conductivity is required, such as general electrical devices having a heat generating element.

As has been described, according to the present invention, a thermal resistor that is a stack of a plurality of metal plates that are arranged to be brought into a partial contact with each other and define an air gap therebetween, so that the temperature of the housing can be reduced, enabling improvements in reliability and costs of the semiconductor device.

In the above examples, the thermal resistor is inserted between the semiconductor device and the copper plate, it may be inserted between the copper plate and another component connected to the semiconductor device.

Also similar advantageous results can be obtained by inserting the thermal resistor between the driver for controlling the semiconductor device and the semiconductor device. The control terminal of a module does not carry a massive current, so that the heat generated by the electrical resistance at the contact portion is small and it is easy to make a multi-layered arrangement.

Also, the thermal resistor is inserted between the semiconductor device and the copper plate in the above examples, the electrode itself of the semiconductor device, or the copper plate itself, or the contact portion of the terminal of the component connected to the semiconductor device itself may by a thermal resistor.

Also, the thermal resistor is used when the temperature of the semiconductor device is high in the above examples, it is of course applicable where the surrounding temperature is higher and it is desired to prevent the heat from flowing into the semiconductor device.

The invention claimed is:

1. A semiconductor device including connection portion for an electrical connection, comprising:
   a thermally resistive member including a metal member that is arranged to be brought into a partial contact with a contact surface of the connection portion,
   wherein the thermally resistive member comprises a stack of a plurality of metal members shaped whereby each of the plurality of metal members are arranged to be brought into a partial contact with each other and that define an air gap between each of the metal members.

2. A semiconductor device as claimed in claim 1, wherein the thermally resistive member as a whole is electrically conductive.

3. A semiconductor device as claimed in claim 1, wherein the metal member includes in its surface a plurality of projections and recesses.

4. A semiconductor device as claimed in claim 1, wherein the metal member includes a plurality of folds.

5. A semiconductor device as claimed in claim 2, wherein the metal member includes a plurality of parallel folds, and the metal members are stacked with respect to an adjacent metal member with their folds intersecting with each other.

6. A semiconductor device as claimed in claim 1, wherein the metal member has an elasticity in the thickness direction.

7. A semiconductor device as claimed in claim 1, wherein the metal member includes formed on its surface a coating of a metal different from the metal member.

8. A semiconductor device as claimed in claim 1, further comprising:
   a semiconductor element; and
   a housing for enclosing the semiconductor element, the housing including a heat dissipating substrate supporting the semiconductor element and dissipating heat generated from the semiconductor element and a housing cover connected to the heat dissipating substrate,
   wherein the thermally resistive member is inserted between the semiconductor element and the housing cover.

9. An electrical device comprising:
   a semiconductor device;
   a component electrically connected to the semiconductor device;

an electrically conductive component having an electrical conductivity electrically connecting the semiconductor device and the component; and a thermally resistive member inserted between the semiconductor device and the electrically conductive component or between the semiconductor device and the component electrically connected to the semiconductor device, wherein the thermally resistive member, including a metal member, is arranged to be brought into a partial contact with a contact surface, wherein the thermally resistive member comprises a stack of a plurality of metal members shaped whereby each of the plurality of metal members are arranged to be brought into a partial contact with each other and define an air gap between each of the metal members.

10. An electrical device as claimed in claim 9, wherein the thermally resistive member as a whole is electrically conductive.

11. An electrical device as claimed in claim 9, wherein the metal member includes in its surface a plurality of projections and recesses.

12. An electrical device as claimed in claim 9, wherein the metal member includes a plurality of folds.

13. An electrical device as claimed in claim 10, wherein the metal member includes a plurality of parallel folds, and the metal members are stacked with respect to the adjacent metal member with their folds intersecting with each other.

14. An electrical device as claimed in claim 9, wherein the metal member has an elasticity in the thickness direction.

15. An electrical device as claimed in claim 9, wherein the metal member includes formed on its surface a coating of a metal different from the metal member.

16. A semiconductor device including connection portion for an electrical connection, comprising:

a thermally resistive member including a metal member including a plurality of folds that is arranged to be brought into a partial contact with a contact surface of the connection portion to define an air gap between the folds.

17. A semiconductor device as claimed in claim 16, wherein the metal members are stacked with respect to an adjacent metal member with their folds intersecting with each other.

18. A semiconductor device including connection portion for an electrical connection, comprising:

a thermally resistive member including a metal member including a plurality of folds that is arranged to be brought into a partial contact with a contact surface of the connection portion to define an air gap therebetween, wherein the metal member has an elasticity in the thickness direction.

19. A semiconductor device including connection portion for an electrical connection, comprising:

a thermally resistive member including a metal member including a plurality of folds that is arranged to be brought into a partial contact with a contact surface of the connection portion to define an air gap between the folds, further comprising:

a semiconductor element; and a housing for enclosing the semiconductor element, the housing including a heat dissipating substrate supporting the semiconductor element and dissipating heat generated from the semiconductor element and a housing cover connected to the heat dissipating substrate, wherein the thermally resistive member is inserted between the semiconductor element and the housing cover.

20. A semiconductor device having a connection portion for electrical connection to a semiconductor element, comprising:

a thermally resistive member including a metal member that is arranged to be brought into a plurality of partial contacts with a contact surface of the connection portion to define an air gap therebetween, wherein a current that flows in the semiconductor element divides into the partial contact portions of the thermally resistive member.

21. A semiconductor device as claimed in claim 20, wherein the partial contact portions are a plurality of convex portions of the thermally resistive member.

22. A semiconductor device as claimed in claim 20, wherein the thermally resistive member including the partial contact portions is an integral metal board.

23. An electrical device comprising:

a semiconductor device;

a component electrically connected to the semiconductor device;

an electrically conductive component having an electrical conductivity electrically connecting the semiconductor device and the component;

a thermally resistive member inserted between the semiconductor device and the electrically conductive component or between the semiconductor device and a component electrically connected to the semiconductor device, wherein the thermally resistive member is a metal member and is arranged to be brought into a plurality of partial contacts with a contact surface to define an air gap therebetween, wherein a current that flows in the semiconductor element divides into the partial contact portions of the thermally resistive member.

24. An electrical device as claimed in claim 23, wherein the partial contact portions are a plurality of convex portions of the thermally resistive member.

25. An electrical device as claimed in claim 23, wherein the thermally resistive member including the partial contact portions is an integral metal board.

* * * * *